(12) United States Patent
Lentz et al.

(10) Patent No.: US 6,828,592 B2
(45) Date of Patent: Dec. 7, 2004

(54) OPTOELECTRONIC DEVICE AND METHOD OF MANUFACTURE THEREOF

(75) Inventors: Charles W. Lentz, Reading, PA (US); Bettina A. Nechay, Allentown, PA (US); Abdallah Ougazzaden, Breinigsville, PA (US); Padman Parayanthal, Clinton Township, Hunterdon County, NJ (US); George J. Przybylek, Douglasville, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 179 days.

(21) Appl. No.: 10/120,923

(22) Filed: Apr. 11, 2002

(65) Prior Publication Data

US 2003/0194827 A1 Oct. 16, 2003

(51) Int. Cl.[7] .................................... H01L 29/225
(52) U.S. Cl. ........................................ 257/94
(58) Field of Search .................... 257/97, E33.006, 257/E33.021, E33.046, E33.052, E31.112, E31.118

(56) References Cited

U.S. PATENT DOCUMENTS

| | | | |
|---|---|---|---|
| 6,028,875 A | * 2/2000 | Knight et al. | 372/46 |
| 6,277,663 B1 | 8/2001 | Matsumoto et al. | |
| 6,437,372 B1 | * 8/2002 | Geva et al. | 257/94 |
| 6,664,605 B1 | * 12/2003 | Akulova et al. | 257/432 |

* cited by examiner

*Primary Examiner*—W. David Coleman

(57) ABSTRACT

The present invention provides an optoelectronic device and a method of manufacture thereof. In one embodiment, the method of manufacturing the optoelectronic device may include creating a multilayered optical substrate and then forming a self aligned dual mask over the multilayered optical substrate. The method may further include etching the multilayered optical substrate through the self aligned dual mask to form a mesa structure.

6 Claims, 11 Drawing Sheets

OPTOELECTRONIC DEVICE AND METHOD OF MANUFACTURE THEREOF

TECHNICAL FIELD OF THE INVENTION

The present invention is directed, in general, to a communication device and, more specifically, to an optoelectronic device and method of manufacture thereof.

BACKGROUND OF THE INVENTION

One common structure currently employed in optoelectronic devices is the p-i-n (PIN) device. In a typical PIN device, an intrinsic layer is disposed between a p-type layer and a n-type layer, forming a heterostructure device. The intrinsic layer has a larger index of refraction than the p and n layers, resulting in a natural waveguide. Furthermore, the energy band discontinuities in the conduction and valence bands in the PIN device facilitate carrier confinement within the active layer. In short, the PIN device is well suited for a variety of emitting and detecting optoelectronic device applications.

Presently, it is common for PIN devices to be formed as buried PIN structures. In such devices, a mesa strip is formed out of the traditional PIN device, and thereafter, blocking layers are positioned on the sides of the mesa strip. Often, the blocking layers are doped with impurity ions, such as iron, ruthenium or titanium, to form semi-insulating blocking layers. It has been found that the addition of iron-impurity ions increases the resistivity of the blocking layers and reduces the leakage current that typically occurs at the interface between the PIN device and the blocking layers. After the blocking layers have been formed, it is common for a P-type (zinc) doped cladding layer to be formed thereover, thus forming a capped-mesa buried heterostructure (CMBH).

A problem arises in those CMBH structures, in that the iron doped blocking layers are in contact with the zinc doped cladding layer, and the zinc and iron inter-diffuse when subjected to high temperatures. This inter-diffusion, tends to increase the device's current leakage and parasitic capacitance, both of which are very undesirable.

One approach the optoelectronic industry attempted to reduce this inter-diffusion, was to form an undoped setback layer between the doped cladding layer and the blocking layers. While the undoped setback layer reduced, or substantially eliminated, the aforementioned inter-diffusion, it misplaced the position of the p-n junction. Other approaches were also attempted, however, each of those approaches was equally unsuccessful.

Accordingly, what is needed in the art is an optoelectronic device, and a method of manufacture therefor, that does not experience the drawbacks experienced by the devices disclosed above. Namely, a device that does not experience the inter-diffusion issues is desired.

SUMMARY OF THE INVENTION

To address the above-discussed deficiencies of the prior art, the present invention provides an optoelectronic device and a method of manufacture thereof. In one embodiment, the method of manufacturing the optoelectronic device may include creating a multilayered optical substrate and then forming a self aligned dual mask over the multilayered optical substrate. The method may further include etching the multilayered optical substrate through the self aligned dual mask to form a mesa structure.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the electronic industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
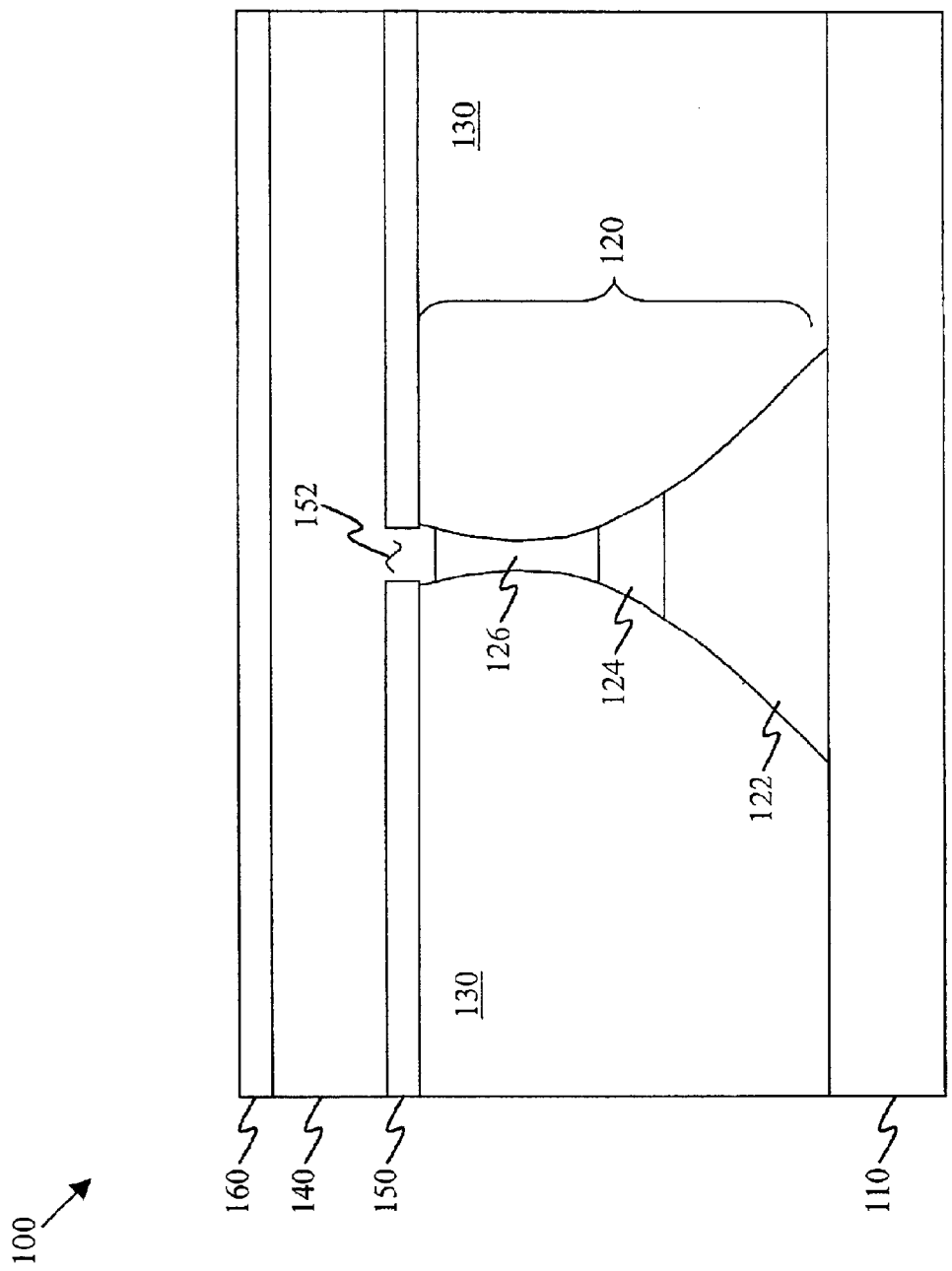
FIG. 1 illustrates a cross-sectional view of one embodiment of an optoelectronic device in accordance with the principles of the present invention.

Referring initially to FIG. 1, illustrated is a cross-sectional view of one embodiment of an optoelectronic device 100, as disclosed herein. The present invention is broadly directed to an optoelectronic device 100 made of any material or compound that may have use in such devices. In the illustrative embodiments described herein, the optoelectronic device 100 is specifically discussed as a group III-V based device, for example an indium phosphide/indium gallium arsenide phosphide based device, a gallium arsenide based device, an aluminum gallium arsenide based device, or another group III-V based device. Even though the present invention is discussed in the context of a group III-V based device, it should be understood that the present invention is not limited to group III-V compounds and that other compounds located outside groups III-V, may be used.

In addition to the optoelectronic device 100 being discussed as a group III-V based device, the optoelectronic device 100 is further being discussed as a PIN diode. While the present invention is discussed in the context of a PIN diode, it should be noted that other devices, such as lasers, photodetectors, avalanch photo-diode detectors (APDs), modulators, or other similar devices, may comprise the optoelectronic device 100. As an example, the present invention is particularly suited for any optical device including a mesa structure.

Turning back to the illustrative embodiment of FIG. 1, the optoelectronic device 100 includes a mesa structure 120 formed over a substrate 110. The mesa structure 120 may comprise a variety of layers and materials. In the embodiment shown, however, the mesa structure 120 includes a first layer 122 (e.g., a first cladding layer), a conventional intrinsic layer 124, and a second layer 126 (e.g., a second cladding layer).

The optoelectronic device 100 shown in FIG. 1 also includes conventional blocking layers 130 located along opposing sides of the mesa structure 120. In the particular embodiment shown, the blocking layers 130 are doped with iron. While iron is the dopant chosen for this particular embodiment, other dopants, such as ruthenium, titanium, or another similar dopant, may be used.

The optoelectronic device 100 illustrated in FIG. 1 further includes an upper cladding layer 140 located over the blocking layers 130 and the mesa structure 120. The upper cladding layer 140 may comprise various materials and dopants. For example, in an exemplary embodiment, the upper cladding layer is a P-type doped indium phosphide (InP) upper cladding layer. Additionally, the upper cladding layer 140 may have numerous different dopant concentrations, including a preferred dopant concentration ranging from about 5E17 atoms/cm$^3$ to about 5E18 atoms/cm$^3$. If formed using molecular beam epitaxy, the dopant could include zinc, beryllium or another similar material.

Uniquely located at least partially over the mesa structure 120 and between the upper cladding layer 140 and the blocking layers 130, is a barrier layer 150. As illustrated, the barrier layer 150 may be a blanket layer having an opening 152 formed therein. It is desirable, if not optimal, that the opening 152 be located over a peak of the mesa structure 120. In an exemplary embodiment, a footprint of the opening 152 is within a footprint of the peak of the mesa structure 120. For example, if a width of the footprint of the peak of the mesa structure 120 ranges from about 1.7 μm to about 2.2 μm, a width of the footprint of the opening would range from about 1.5 μm to about 2.0 μm, respectively.

As illustrated, the opening 152 may allow the upper cladding layer 140 to contact the mesa structure 120. More specifically, the opening 152 may allow the upper cladding layer 140 to contact the second layer 126, the second layer 126 forming a portion of the mesa structure 120. The optoelectronic device 100 illustrated in FIG. 1 further includes a conventional upper contact 160.

That said, in one embodiment of the present invention, such as that shown, the barrier layer 150 substantially reduces the surface area upon which the blocking layers 130 physically contact the upper cladding layer 140. For example, in an exemplary embodiment the surface area upon which the blocking layers 130 physically contact the upper cladding layer 140 is less than about 20,000μ$^2$ (height of about 30μ and into page depth of about 250μ). Accordingly, the blocking layers are not in substantial contact with the upper cladding layer 140. It should be noted, however, that in an exemplary embodiment the surface area upon which the blocking layers 130 physically contacts the upper cladding layer 140 approaches zero.

Accordingly, the optoelectronic device 100 shown in FIG. 1 does not experience the amount of cross-diffusion of dopants between the upper cladding layer 140 and blocking layers 130, that the previous devices experience. Optimally, the barrier layer 150 substantially eliminates the cross-diffusion, resulting in an optoelectronic device with decreased parasitic capacitance, and therefore, increased operating speed.

Figure 2:
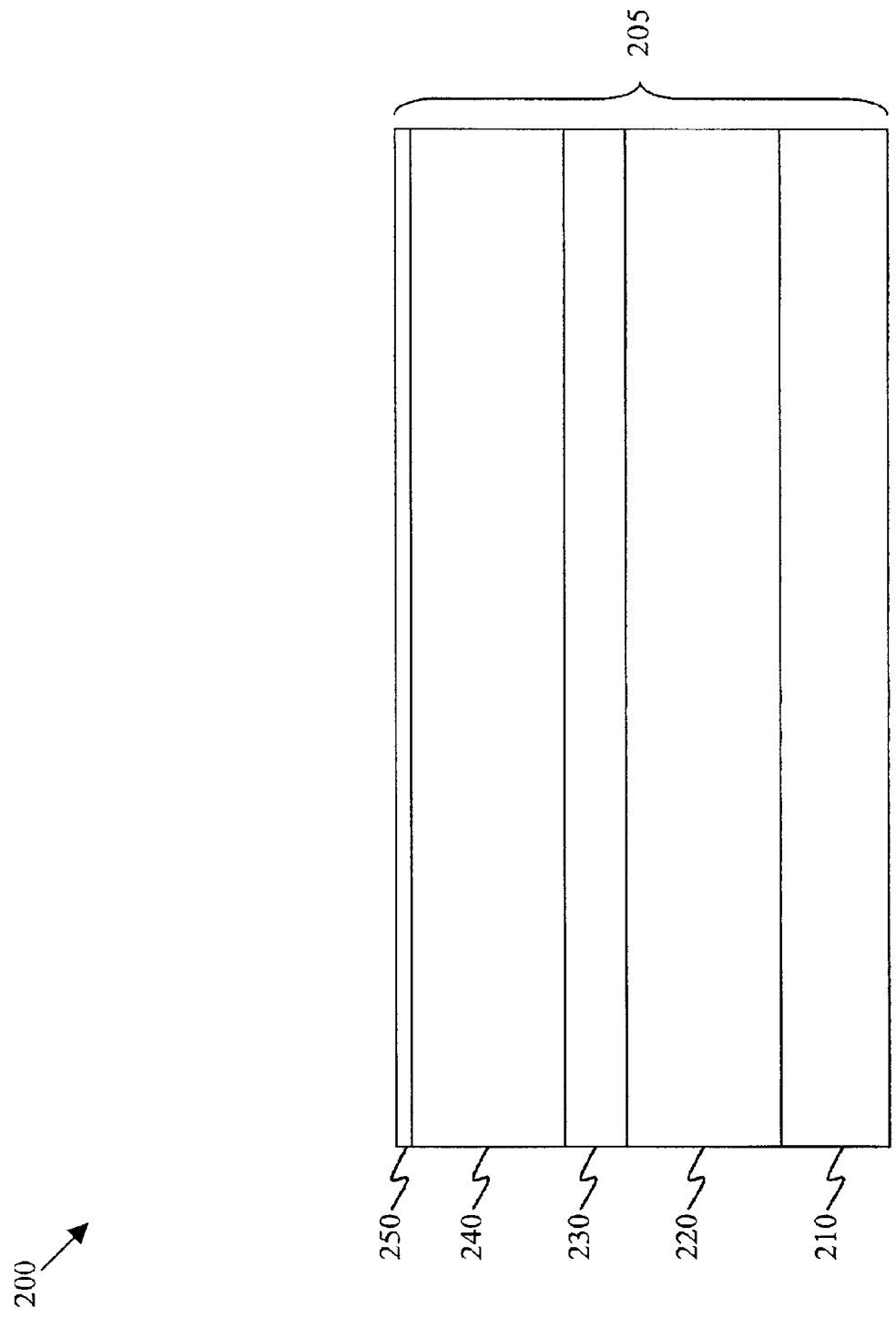
FIG. 2 illustrates a cross-sectional view of a partially completed optoelectronic device.

Turning to FIGS. 2–10, with continued reference to FIG. 1, illustrated are various intermediate stages of the manufacture of a device similar to the optoelectronic device 100 of FIG. 1. FIG. 2 illustrates a cross-sectional view of a partially completed optoelectronic device 200, including a multilayered optical substrate 205. The multilayered optical substrate 205 illustrated in FIG. 2, includes a first layer 220, which in a previous step (not shown) was formed over a substrate 210. The substrate 210 may be any layer located in an optical device, including a layer located at the wafer level or a layer located above or below the wafer level. The substrate 210, in an exemplary embodiment, is a highly N-type doped indium phosphide (InP) substrate, or in an alternative embodiment, a semi-insulating layer with a highly N-type doped InP layer located thereover.

As previously mentioned, located over the substrate 210 may be the first layer 220. The first layer 220, in the illustrative embodiment, is an N-type doped InP cladding layer. It should be understood that the first layer 220 is not limited to a N-type doped InP layer, and that other materials, doped or undoped, may be used.

An intrinsic layer 230 may be located over the substrate 210 and first layer 220. The intrinsic layer 230, as one skilled in the art readily recognizes, may be a quantum well region, and may, in an exemplary embodiment, include separate confining layers (not shown). In an exemplary embodiment of the invention, the intrinsic layer 230 includes materials chosen from group III-V compounds. The intrinsic layer 230 is typically intentionally not doped, however, in an alternative embodiment it may be doped as long as the p-n junction placement is taken into consideration.

Further illustrated in FIG. 2, is a second layer 240 formed over the intrinsic layer 230. The second layer 240, in an exemplary embodiment, is an indium phosphide cladding layer having a dopant formed therein. The dopant is typically a P-type dopant such as zinc; however, one having skill in the art understands that other dopants, such as cadmium, beryllium and magnesium may be used in this capacity.

Formed over the second layer 240 is a sacrificial layer 250. In the particular embodiment shown, the sacrificial layer 250 is a quaternary layer comprising indium gallium arsenide phosphide (InGaAsP). Additionally, the sacrificial layer 250 may have varying thicknesses. For example, a thickness ranging from about 20 nm to about 40 nm, as well as others, is quite common for the sacrificial layer 250.

The substrate 210, first layer 220, intrinsic layer 230, second layer 240, and sacrificial layer 250 may all be formed using conventional deposition processes. For example, a metal organic vapor-phase epitaxy (MOVPE), molecular beam epitaxy (MBE), liquid phase epitaxy (LPE), or another similar epitaxial process may be used to form the various layers. In an exemplary embodiment, layers 210, 220, 230, 240 and 250 are all formed in the same process chamber. For example, in one advantageous embodiment, the partially completed optoelectronic device 200, including the substrate 210, may be placed within a MOCVD process chamber, wherein each of the remaining layers 220–250 are formed. In one advantageous embodiment, the MOVPE process may be conducted at a temperature ranging from about 530° C. to about 700° C., and a growth chamber pressure ranging from about 20 mbar to about atmospheric pressure. It should be noted, however, that the process parameters required to manufacture the optoelectronic device 200 may vary without departing from the scope of the present invention.

Figure 3:
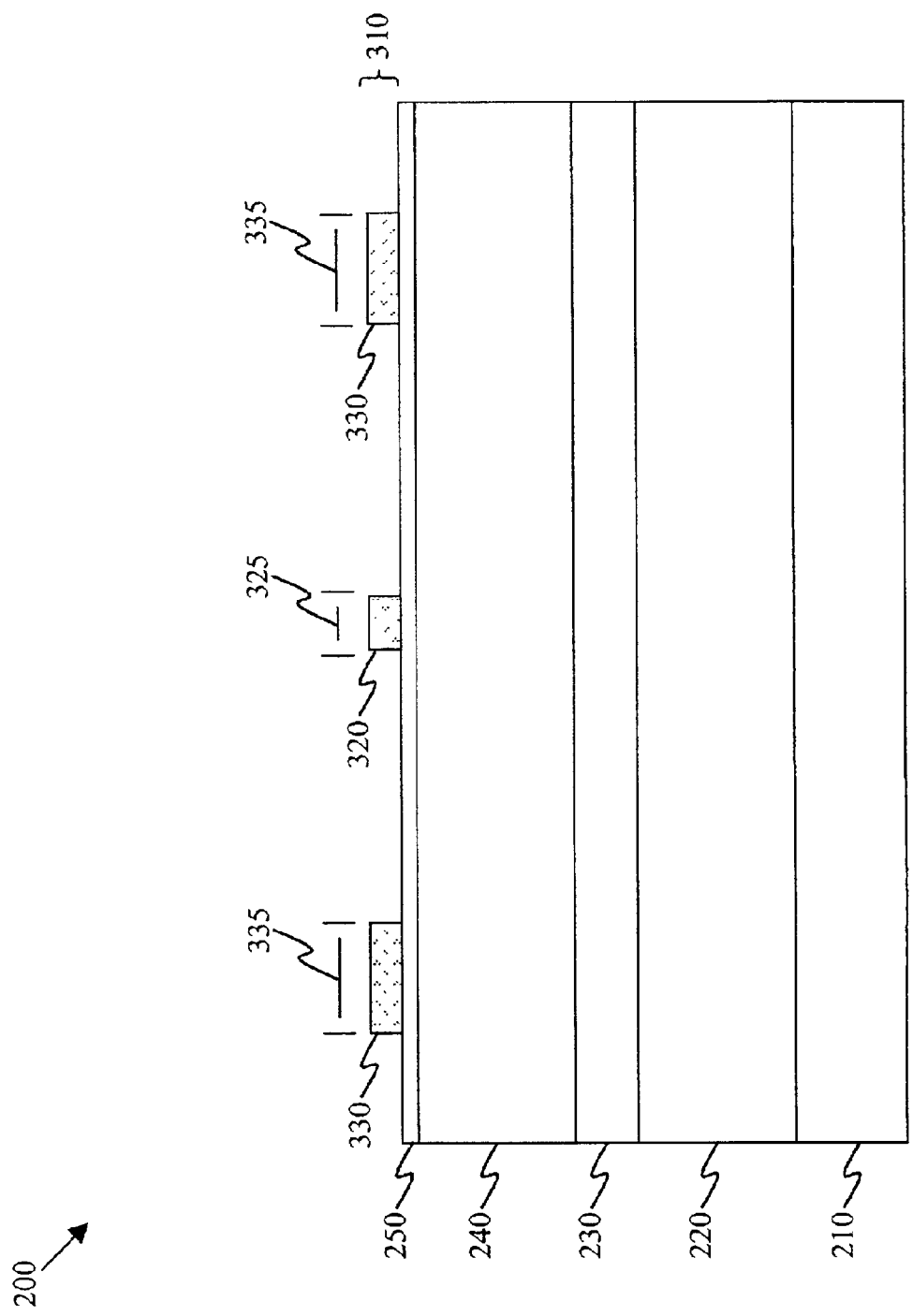
FIG. 3 illustrates the partially completed optoelectronic device illustrated in FIG. 2, after formation of a first mask region.

Turning to FIG. 3, illustrated is the partially completed optoelectronic device 200, after formation of a mask region 310. The mask region 310 may comprise a number of various materials while staying within the scope of the present invention. In one exemplary embodiment, it has been determined that tantalum pentoxide, or another similar material, is particularly beneficial. It should be noted, however, that it may be important in certain circumstances that the mask region 310 require a particular etchant that is selective only to that material. This idea will be explored further below. The mask region 310 may be formed using conventional deposition and masking techniques.

As illustrated in FIG. 3, the mask region 310 includes an inner mask portion 320 and outer mask portions 330. The inner mask portion 320 should be designed having a width 325 that corresponds to a desired width of a resulting mesa structure. For example, referring back to FIG. 1 for illustration purposes only, the width of the resulting mesa structure 120 is directly associated with the width 325 of the inner mask portion 320. In one embodiment of the invention, the width of the peak of the mesa structure 120 ranges from about 1 $\mu$m to about 2.2 $\mu$m, with a preferred value being about 1.7 $\mu$m. Accordingly, the width 325 of the inner mask portion 320 should range from about 1 $\mu$m to about 2 $\mu$m, with a preferred value being about 1.5 $\mu$m. While it may not be observed from the cross-sectional view shown in FIG. 3, the inner mask portion 320 may have a length that ranges from about 300 $\mu$m to about 400 $\mu$m.

As previously mentioned, the mask region 310 also includes outer mask portions 330. While many widths 335 and positions of the outer mask portions 330 may be used, in one particular embodiment they are specifically designed to provide alignment for a subsequently formed mask. Accordingly, each of the outer mask portions 330 may have widths 335 ranging from about 2 $\mu$m to about 3.0 $\mu$m.

Figure 4:
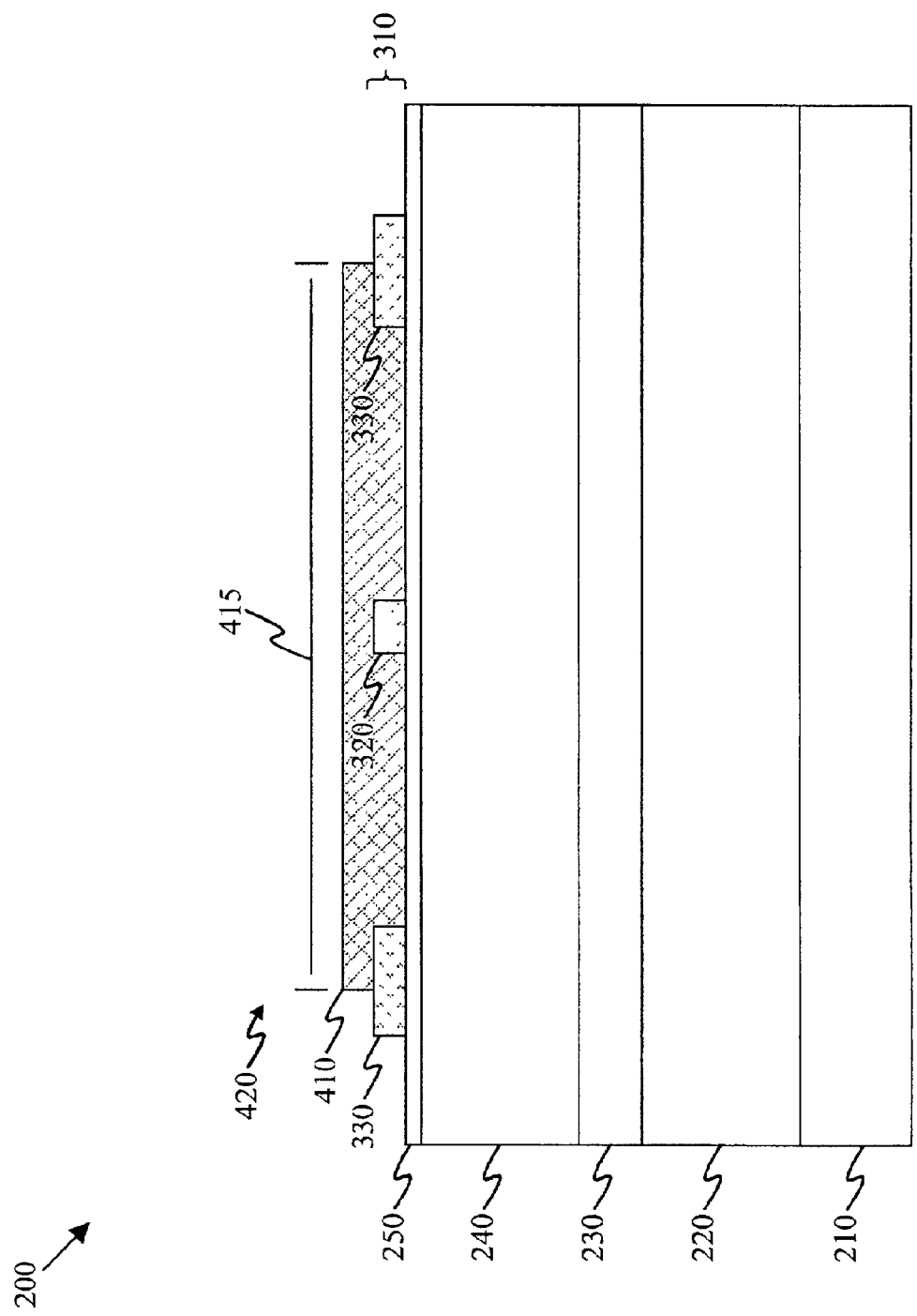
FIG. 4 illustrates the partially completed optoelectronic device illustrated in FIG. 3, after formation of a second mask region over the first mask region.

Turning now to FIG. 4, illustrated is the partially completed optoelectronic device 200 illustrated in FIG. 3, after formation of a mask region 410 over the mask region 310, resulting in a completed self aligned dual mask 420. The mask region 410, similar to the mask region 310, should be particularly chosen for its desired function. Thus, in one embodiment of the invention, the mask region 410 should comprise a material which requires an etchant that is selective only to that material. Stated another way, the etchant required to etch mask regions 310 should not also etch the mask region 410, and vice versa. Accordingly, it has been determined that any dielectric material type mask, such as a silicon dioxide mask, works very well as the mask region 410. Other materials, however, may comprise the mask region 410 while staying within the scope of the present invention.

In an exemplary embodiment, the mask region 410 has a width 415 ranging from about 5 $\mu$m to about 10 $\mu$m, with an optimal width 415 of about 6 $\mu$m. It should be noted, however, that the width 415 of the mask region 410 is directly related to the depth one wishes to etch into the layers 210, 220, 230, 240 and 250 to form the mesa structure 120 (FIG. 1). Similar to the mask region 310, the mask region 410 may have a length ranging from about 300 $\mu$m to about 400 $\mu$m. As illustrated, the outer mask portions 330 may be used as alignment marks to pattern the mask region 410.

Figure 5:
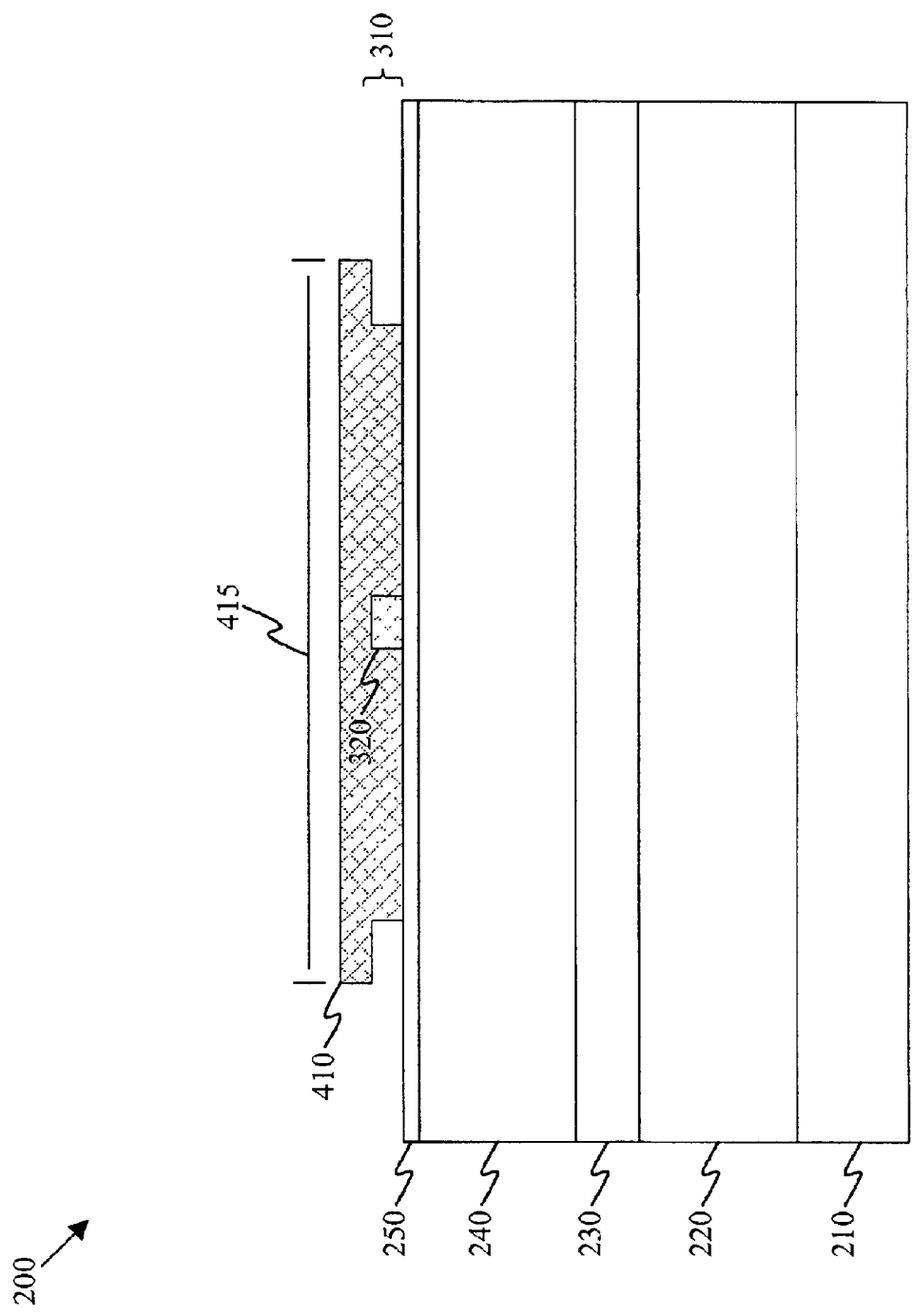
FIG. 5 illustrates the partially completed optoelectronic device illustrated in FIG. 4, after removal of outer mask portions.

Turning briefly to FIG. 5, illustrated is the partially completed optoelectronic device 200 illustrated in FIG. 4, after removal of the outer mask portions 330. Because the mask region 310 has an etch selectivity different from that of the mask region 410, the outer mask portions 330 may be removed without harm to the mask region 410.

Figure 6:
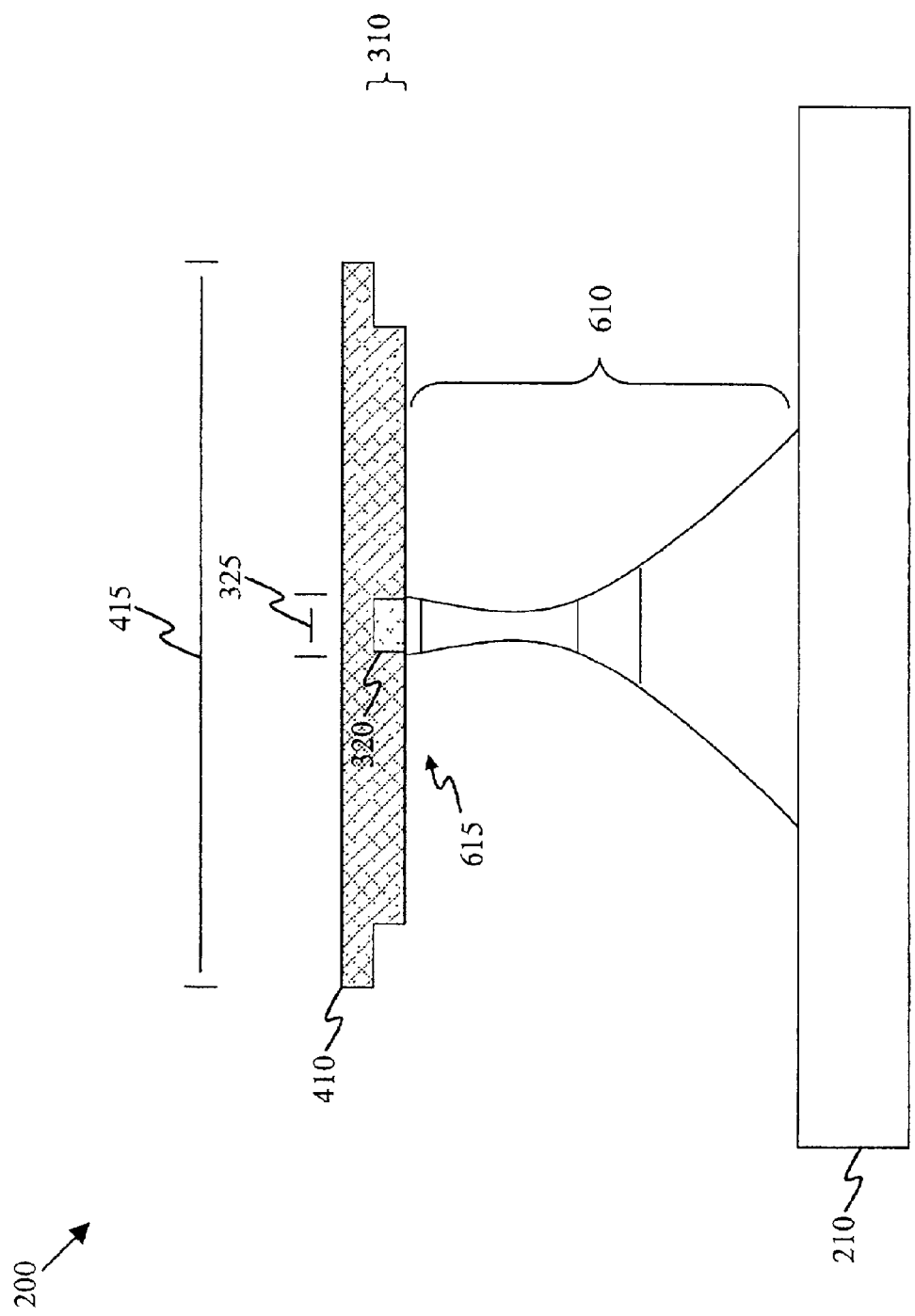
FIG. 6 illustrates the partially completed optoelectronic device illustrated in FIG. 5, after formation of a mesa structure.

Turning now to FIG. 6, illustrated is the partially completed optoelectronic device 200 illustrated in FIG. 5, after formation of a mesa structure 610. Generally, the mesa structure 610 may be formed using a conventional wet etch. For example, the etching may be carried out by using a conventional Br-methanol solution or a solution comprising a mixture of oxygenated water and hydrochloric acid. While two different etchant materials have been discussed, others are within the purview of the present invention.

As can be observed in FIG. 6, the conventional wet etch may have both a vertical component and a horizontal component. For example, it is common for the ratio of vertical etch to horizontal etch to be about 1 to 1. That given, a width 615 of the mesa structure 610 may be controlled by varying the width 325 of the inner mask portion, the width 415 of the mask region 410, and the depth at which one etches into the layers 210, 220, 230, 240 and 250 (FIG. 5). It is generally optimal to commence etching the mesa structure 610 before the width 615 of the mesa structure 610 becomes less than the width 325 of the inner mask portion 310.

Figure 7:
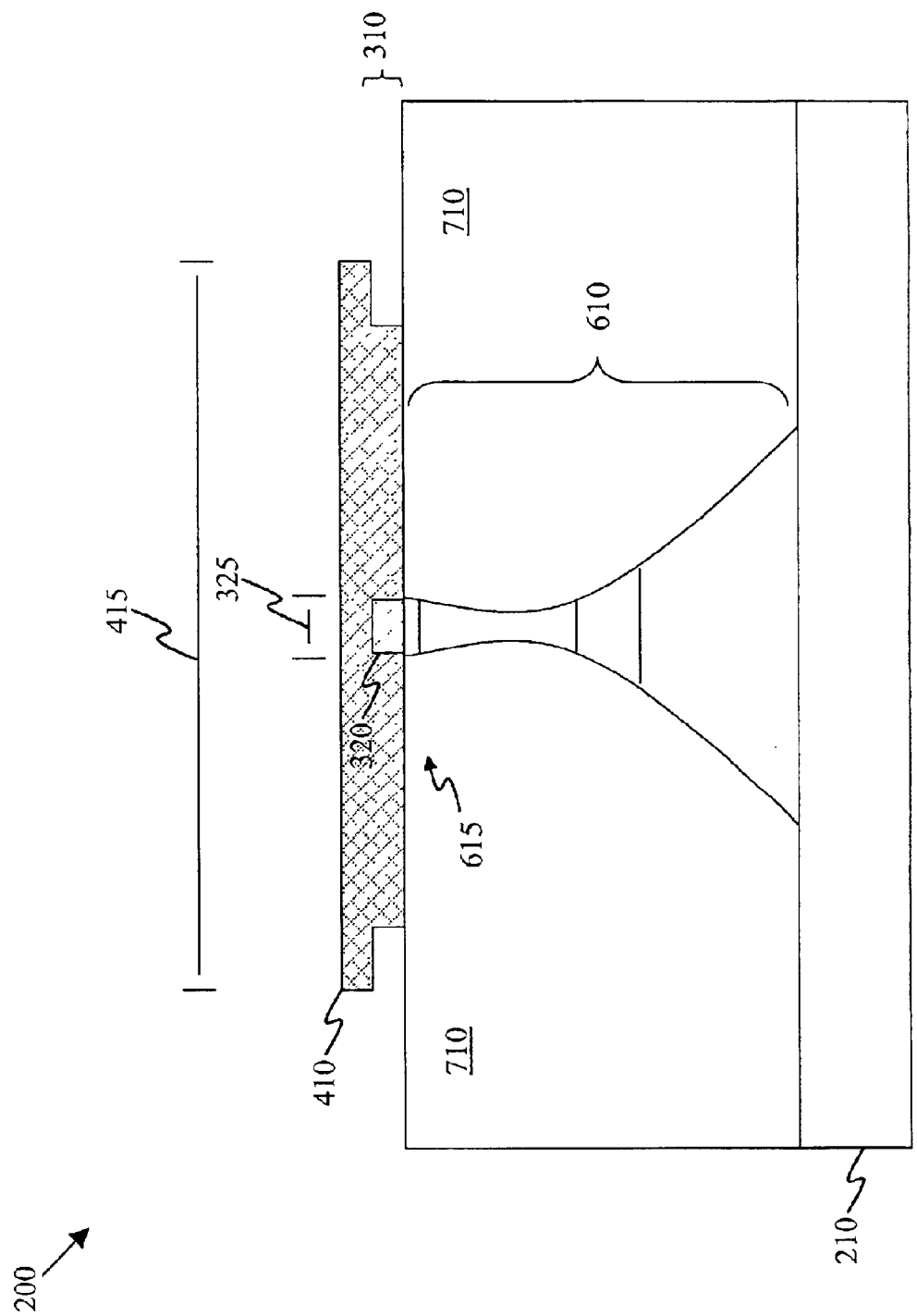
FIG. 7 illustrates the formation of blocking layers on opposing sides of the mesa structure shown in FIG. 6.

Turning now to FIG. 7, illustrated is the formation of blocking layers 710 on opposing sides of the mesa structure 610. In an exemplary embodiment, the blocking layers 710 may be doped InP layers formed using a conventional MOCVD or MOVPE process. In the particular embodiment shown, the blocking layers 710 are doped with iron having a dopant concentration ranging from about 1E17 atoms/cm$^3$ to about 3E17 atoms/cm$^3$. While iron is the dopant chosen for this particular embodiment, other dopants, such as ruthenium, titanium, or another similar dopant, may be used. Additionally, while it has been illustrated that the blocking layers 710 are formed in direct contact with the mesa structure 610, one skilled in the art understands that various other layers, such as dopant barrier layers, may be interposed between the two.

Figure 8:
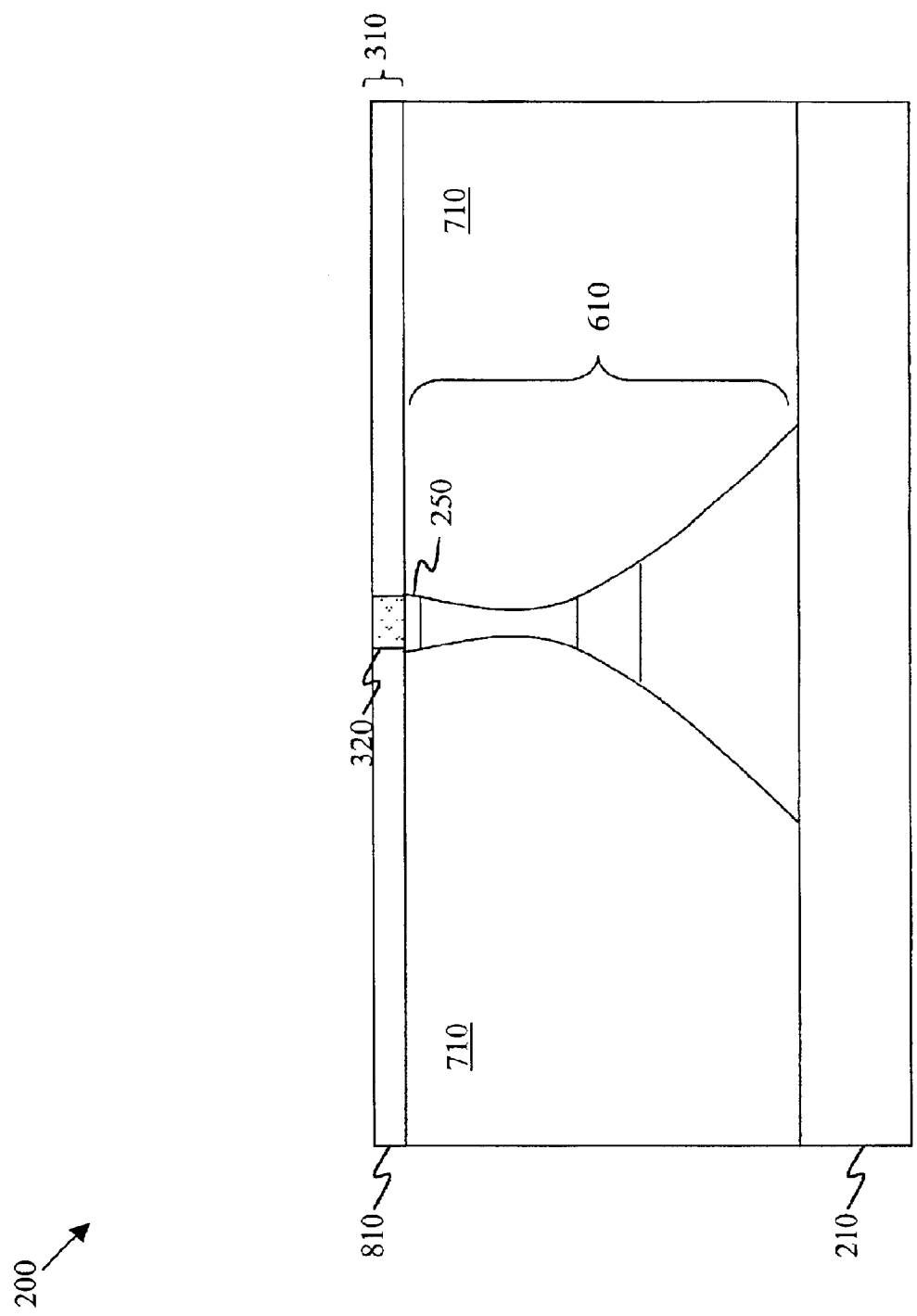
FIG. 8 illustrates the partially completed optoelectronic device illustrated in FIG. 7, after removal of the mask portion and formation of a barrier layer over the blocking layers and over at least a portion of the mesa structure.

Turning now to FIG. 8, illustrated is the partially completed optoelectronic device 200 illustrated in FIG. 7, after removal of the mask region 410 (FIG. 7), and formation of a barrier layer 810 over the blocking layers 710 and over at least a portion of the mesa structure 610. In an exemplary embodiment of the invention, the mask region 410 is removed using a conventional hydrofluoric (HF) or similar etch. Because the mask region 410 and inner mask portion 320 are dissimilar materials with dissimilar etchant selectivities, the mask region 410 may be easily removed without substantially affecting the inner mask portion 320.

As recited above, after the mask region 410 has been removed, the barrier layer 810 is formed. In an exemplary embodiment, the barrier layer 810 is a blanket layer of N-type doped InP or indium aluminum arsenide (InAlAs), formed over the surface of the optoelectronic device 200. Other materials are, however, within the scope of the present invention. A conventional chemical mechanical planarization, or another similar process, may then be used to planarize the barrier layer 810 down to the inner mask portion 320, resulting in the structure shown in FIG. 8.

Figure 9:
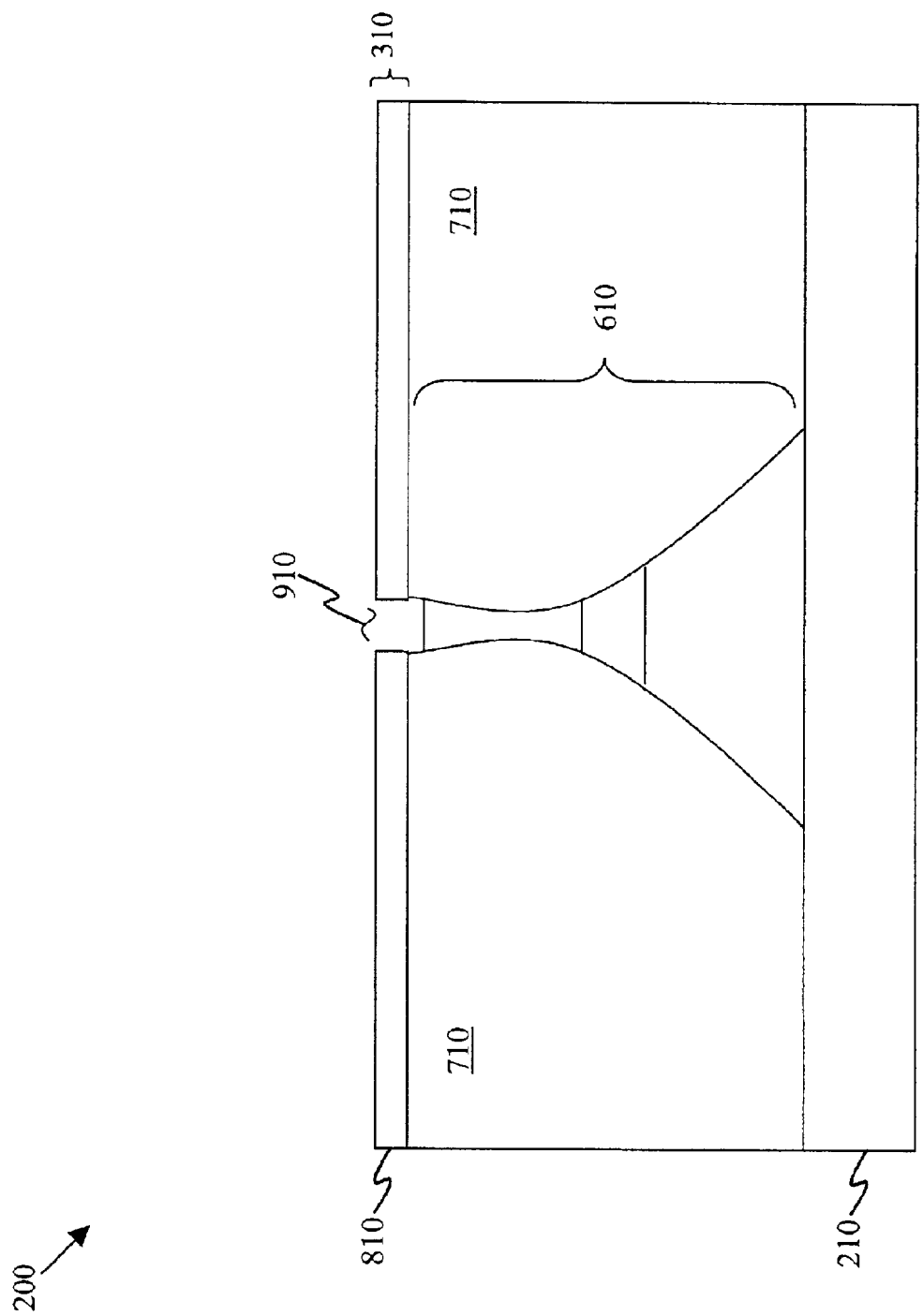
FIG. 9 illustrates the partially completed optoelectronic device illustrated in FIG. 8 after removal of the inner mask portion and sacrificial layer.

Turning now to FIG. 9, illustrated is the partially completed optoelectronic device 200 illustrated in FIG. 8, after removal of the inner mask portion 320 and sacrificial layer 250. One skilled in the art understands how the inner mask portion 320 and sacrificial layer 250 may be removed, including using any conventional etchant capable of removing such layers. As illustrated, after removing the inner mask portion 320 and sacrificial layer 250, the barrier layer 810 has an opening 910 located therein. As further illustrated, a footprint of the opening 910 is within a footprint of the peak of the mesa structure 610.

Figure 10:
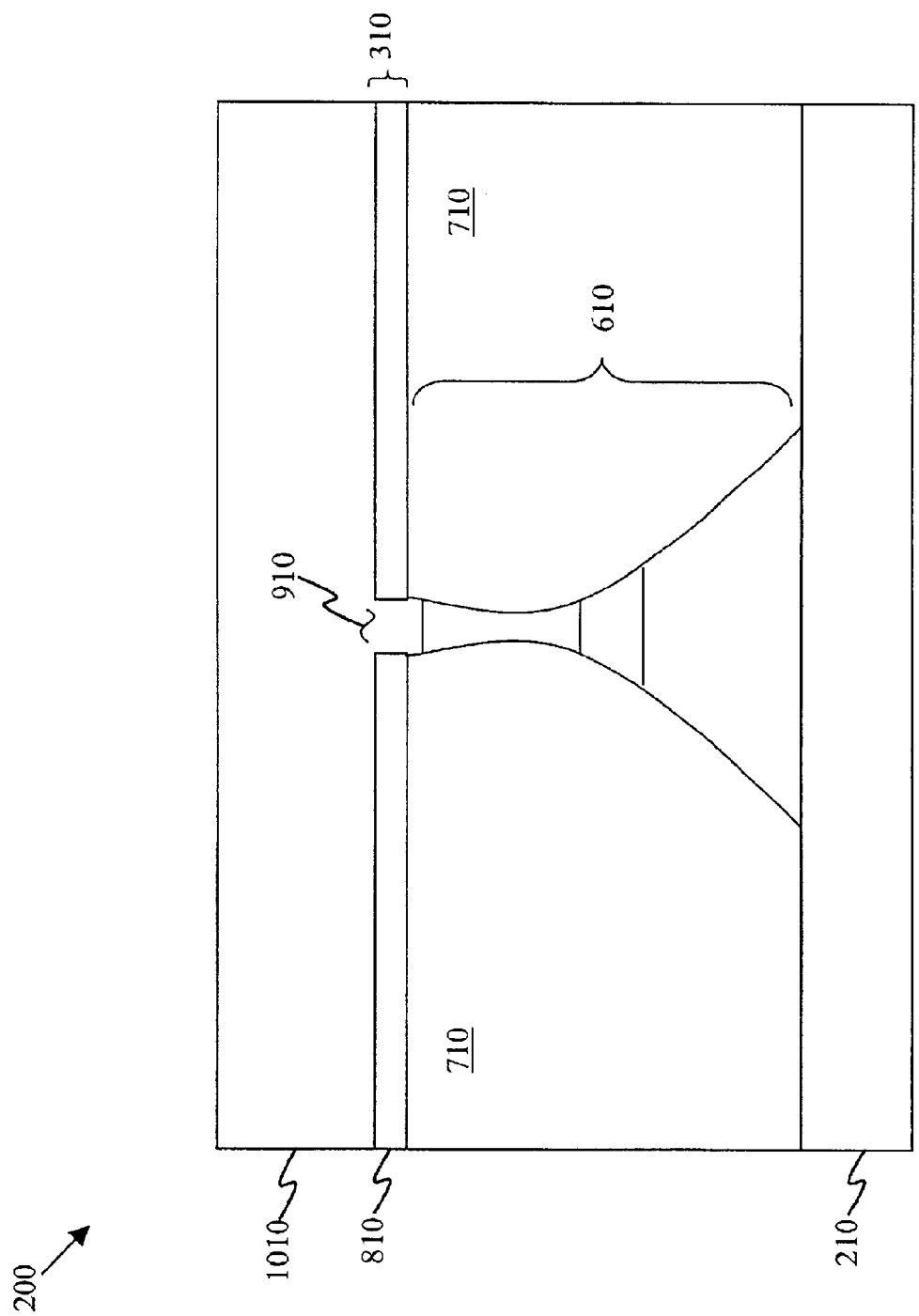
FIG. 10 illustrates the partially completed optoelectronic device illustrated in FIG. 9, after formation of an upper cladding layer.

Turning now to FIG. 10, illustrated is the partially completed optoelectronic device 200 illustrated in FIG. 9, after formation of an upper cladding layer 1010. As illustrated, the upper cladding layer 1010 is formed within the opening 910. The upper cladding layer 1010, in an exemplary embodiment, comprises a conventionally formed P-type doped InP upper cladding layer. For example, zinc doped InP, or another similar material, may be used as the upper cladding layer 1010. After completion of the partially completed optoelectronic device 200 illustrated in FIG. 10, an upper contact layer may be conventionally formed, resulting in a device similar to the optoelectronic device 100 illustrated in FIG. 1.

As previously recited, a benefit of the present method of manufacturing the optoelectronic device 200, and resulting optoelectronic device 200, is the ability to substantially reduce the surface area upon which the blocking layers 710 contact the upper cladding layer 1010, thereby inhibiting the inter-diffusion of the dopants between such layers. Because the inter-diffusion is inhibited, if not substantially eliminated, the parasitic capacitance of the optoelectronic device 200 may be reduced. This, as one skilled in the art understands, also helps increase the operating speed of the optoelectronic device 200.

Figure 11:
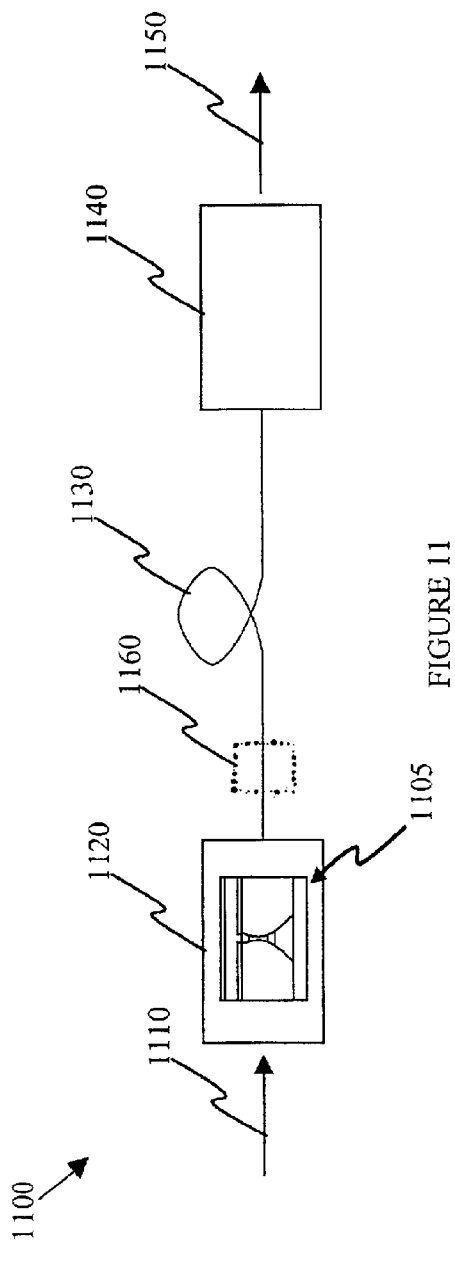
FIG. 11 illustrates an optical fiber communication system, which may form one environment where an optoelectronic device similar to the completed optoelectronic device illustrated in FIG. 1, may be included.

Turning briefly to FIG. 11, illustrated is an optical communication systems 1100, which may form one environment where an optoelectronic device 1105 similar to the completed optoelectronic device 100 illustrated in FIG. 1, may be included. The optical communication system 1100, in the illustrative embodiment, includes an initial signal 1110 entering a transmitter 1120. The transmitter 1120, accepts the initial signal 1110, addresses the signal 1110 in whatever fashion desired, and sends the resulting information across an optical fiber 1130 to a receiver 1140. The receiver 1140 receives the information from the optical fiber 1130, addresses the information in whatever fashion desired, and provides an ultimate signal 1150. As illustrated in FIG. 11, the completed optoelectronic device 1105 may be included within the transmitter 1120. However, the completed optoelectronic device 1105 may also be included anywhere in the optical communication system 1100, including the receiver 1140. The optical communication system 1100 is not limited to the devices previously mentioned. For example, the optical communication system 1100 may include a source 1160, such as a laser or a diode.

Figure 12:
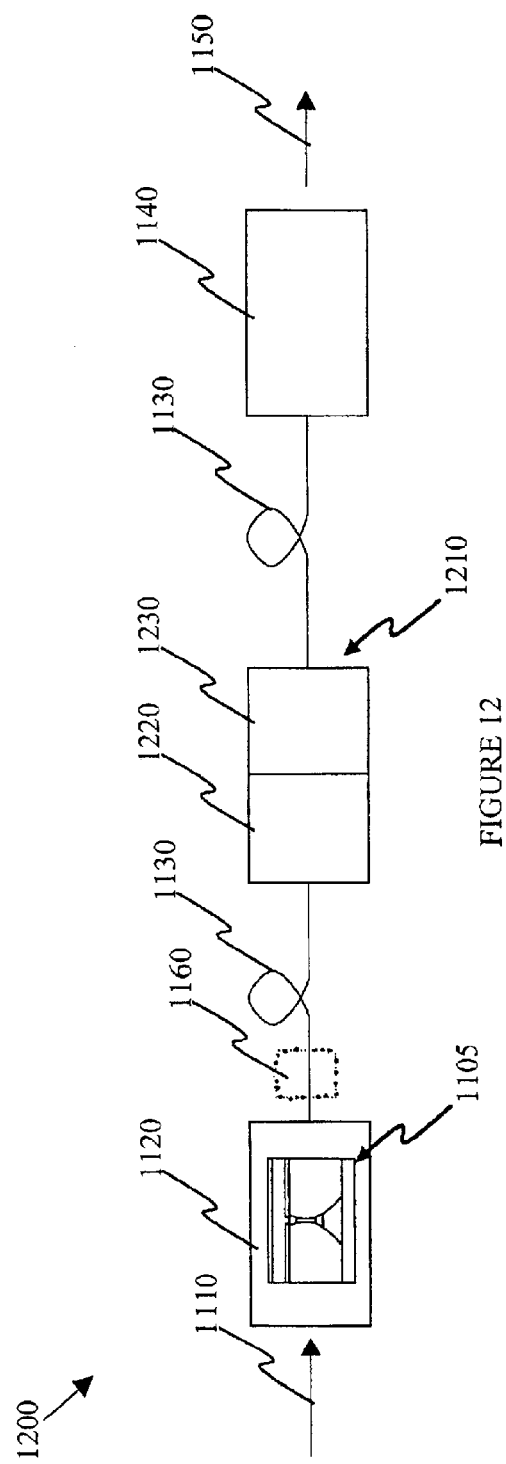
FIG. 12 illustrates an alternative optical fiber communication system.

Turning briefly to FIG. 12, illustrated is an alternative optical communication system 1200, having a repeater 1210, including a second receiver 1220 and a second transmitter 1230, located between the transmitter 1120 and the receiver 1140.

Although the present invention has been described in detail, those skilled in the art should understand that they can make various changes, substitutions and alterations herein without departing from the spirit and scope of the invention in its broadest form.

What is claimed is:

1. An optoelectronic device, comprising:

a mesa structure;

blocking layers located along opposing sides of the mesa structure;

a cladding layer located over the blocking layers and the mesa structure; and a barrier layer located at least partially over a peak of the mesa structure and between the cladding layer and the blocking layers.

2. The optoelectronic device as recited in claim 1 wherein the barrier layer is a blanket layer having an opening formed over the mesa structure.

3. The optoelectronic device as recited in claim 2 wherein a footprint of the opening is within a footprint of the peak of the mesa structure.

4. The optoelectronic device as recited in claim 3 wherein a width of the footprint of the peak of the mesa structure ranges from about 1.7 $\mu$m to about 2.2 $\mu$m and a width of the footprint of the opening ranges from about 1.5 $\mu$m to about 2.0 $\mu$m.

5. The optoelectronic device as recited in claim 2 wherein the cladding layer is located within the opening.

6. The optoelectronic device as recited in claim 1 wherein the mesa structure includes;

a first layer;

an intrinsic layer disposed over the first layer; and a second layer disposed over the first layer.

* * * * *